(12) United States Patent
Feng et al.

(10) Patent No.: US 7,690,324 B1
(45) Date of Patent: Apr. 6, 2010

(54) SMALL-VOLUME ELECTROLESS PLATING CELL

(75) Inventors: Jingbin Feng, Lake Oswego, OR (US); Steven T. Mayer, Lake Oswego, OR (US); Daniel Mark Dinneen, Portland, OR (US); Edmund B. Minshall, Sherwood, OR (US); Christopher M. Bartlett, Beaverton, OR (US); Eric G. Webb, West Linn, OR (US); R. Marshall Stowell, Wilsonville, OR (US); Mark T. Winslow, Camas, WA (US); Avishai Kepten, Lake Oswego, OR (US); Norman D. Kaplan, Portland, OR (US); Richard K. Lyons, Sandy, OR (US); John B. Alexy, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 1256 days.

(21) Appl. No.: 11/200,338

(22) Filed: Aug. 9, 2005

Related U.S. Application Data

(63) Continuation-in-part of application No. 10/609,518, filed on Jun. 30, 2003, now abandoned.

(60) Provisional application No. 60/392,203, filed on Jun. 28, 2002.

(51) Int. Cl.
*B05C 11/02* (2006.01)

(52) U.S. Cl. .................. 118/52; 118/731; 118/429; 118/423

(58) Field of Classification Search .......... 118/52, 118/428, 731, 429, 423, 425, 56; 205/143, 205/157, 137
See application file for complete search history.

(56) References Cited

U.S. PATENT DOCUMENTS

| 4,021,278 | A | | 5/1977 | Hood |
|---|---|---|---|---|
| 4,102,770 | A | * | 7/1978 | Moriarty et al. ............. 204/434 |
| 5,275,690 | A | | 1/1994 | Garwood |
| 5,670,034 | A | * | 9/1997 | Lowery ...................... 205/143 |
| 5,938,845 | A | * | 8/1999 | Ang ........................... 118/429 |
| 6,065,424 | A | | 5/2000 | Shacham-Diamond et al. |
| 6,093,453 | A | | 7/2000 | Ang |
| 6,165,912 | A | | 12/2000 | McConnell et al. |

(Continued)

FOREIGN PATENT DOCUMENTS

WO WO02/059398 * 8/2002

*Primary Examiner*—Brenda A Lamb
(74) *Attorney, Agent, or Firm*—Weaver Austin Villeneuve & Sampson LLP

(57) ABSTRACT

During fluid treatment of a substrate surface, a carrier/wafer assembly containing a substrate wafer closes the top of a microcell container. The carrier/wafer assembly and the container walls define a thin enclosed treatment volume that is filled with treating fluid, such as electroless plating solution. The thin fluid-treatment volume typically has a volume in a range of about from 100 ml to 500 ml. Preferably a container is heated and the treating fluid is pre-heated before being injected into the container. Preferably, the chemical composition, temperature, and other properties of fluid in the thin enclosed fluid-treatment volume are dynamically variable. A rinse shield and a rinse nozzle are located above the container. A carrier/wafer assembly in a rinse position substantially closes the top of the rinse shield.

32 Claims, 8 Drawing Sheets

U.S. PATENT DOCUMENTS

| | | |
|---|---|---|
| 6,431,190 B1 | 8/2002 | Oka et al. |
| 6,537,416 B1 | 3/2003 | Mayer et al. |
| 6,616,772 B2 | 9/2003 | de Larios et al. |
| 6,632,335 B2 | 10/2003 | Kunisawa et al. |
| 6,660,139 B1 * | 12/2003 | Sendai et al. .......... 204/297.01 |
| 6,689,216 B2 * | 2/2004 | Sendai et al. ............... 118/416 |
| 6,713,122 B1 | 3/2004 | Mayer et al. |
| 7,166,204 B2 * | 1/2007 | Sendai et al. ............... 205/143 |
| 2003/0141018 A1 | 7/2003 | Stevens et al. |

\* cited by examiner

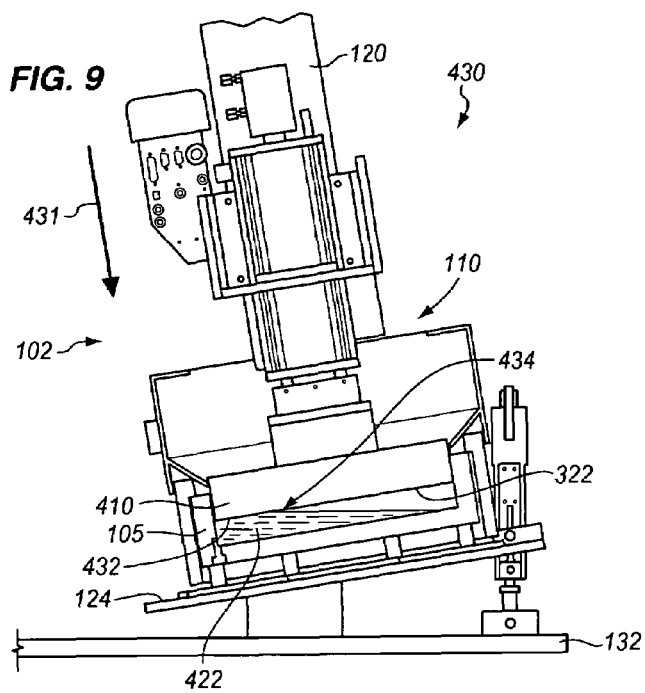
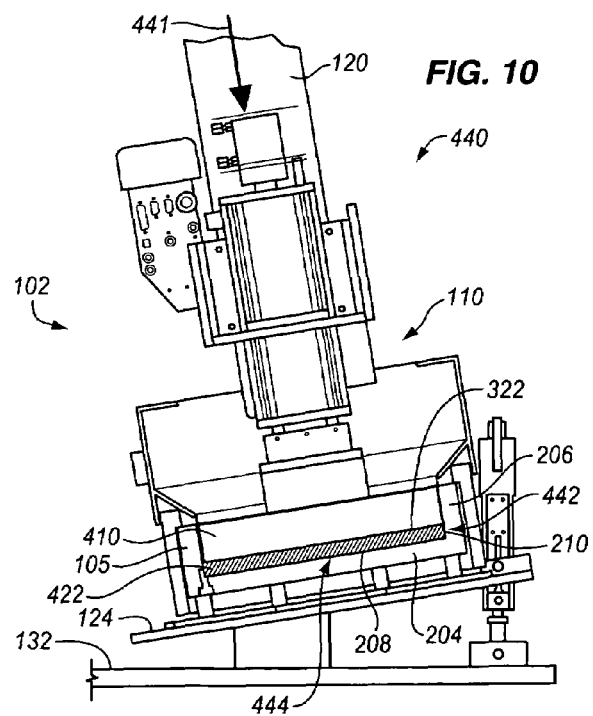

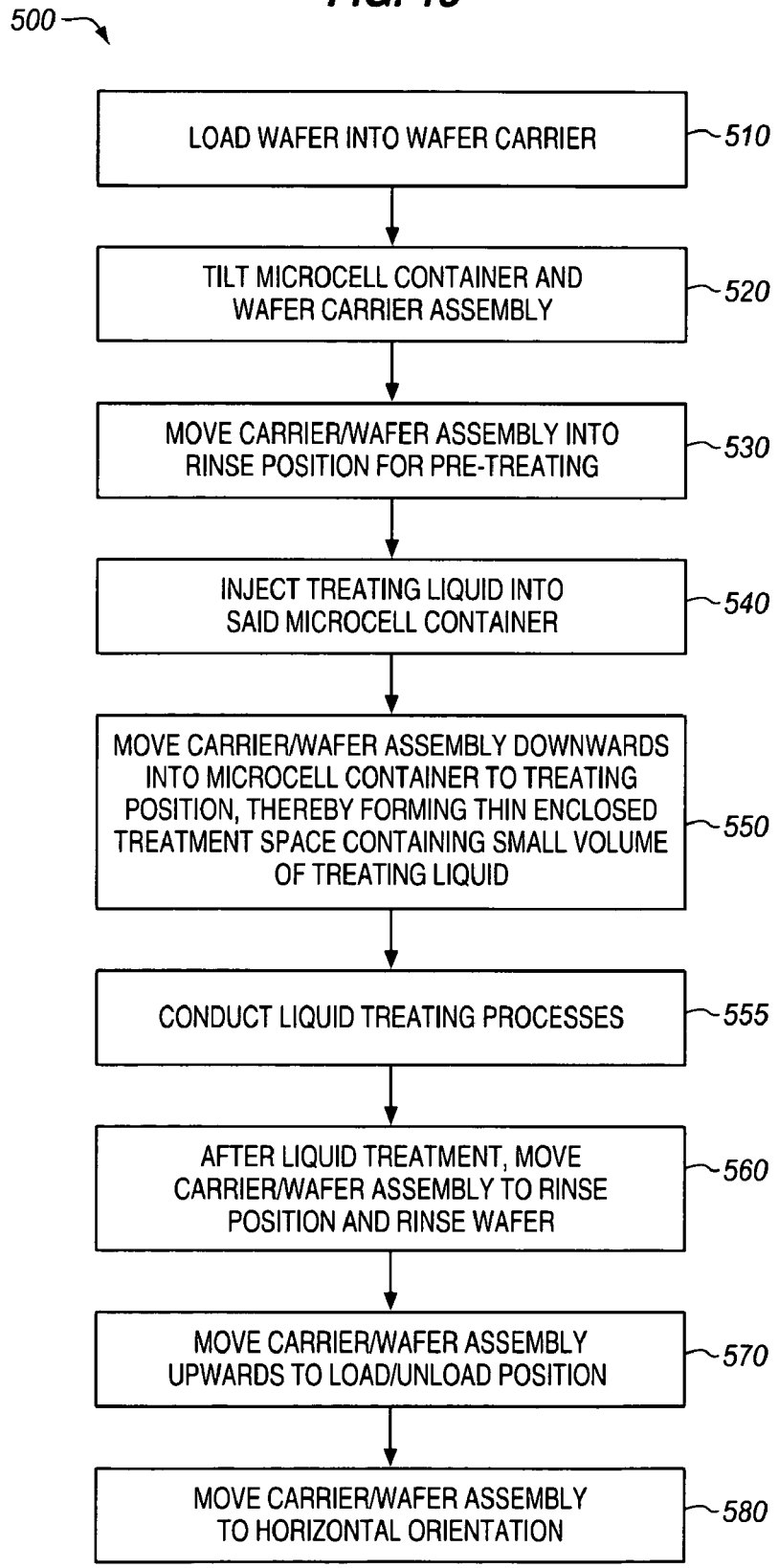

SMALL-VOLUME ELECTROLESS PLATING CELL

RELATED APPLICATIONS

This application is a continuation-in-part application, claiming priority under 35 USC 120, of co-owned and co-pending U.S. patent application Ser. No. 10/609,518, filed Jun. 30, 2003, by Mayer et al., having the title "Liquid Treatment Using Thin Liquid Layer", which claimed the benefit of U.S. Provisional Application Ser. No. 60/392,203, filed Jun. 28, 2002, and which is incorporated herein by reference for all purposes.

FIELD OF THE INVENTION

The invention is related to the field of integrated circuit fabrication, in particular to methods and apparatuses for the electroless deposition of metal thin films using liquid chemical reactions.

BACKGROUND OF THE INVENTION

Electroless plating (or electroless deposition) of copper and other metals has received increasing interest in recent years. This interest is due in part because of the relatively low cost of electroless processes compared to other (e.g., vacuum) deposition techniques, and because of generally surface-controlled, selective, conformal deposition properties of electroless processes. Electroless deposition has a number of potential applications, such as repair of marginal seed layers for copper damascene electroplating, creation of seed layers and barrier layers directly on dielectrics that can be plated, and selective deposition of barrier and electromigration capping layers onto damascene metal (e.g., cobalt and cobalt alloys on copper).

Conventional electroless metal deposition is conducted in a system containing one or multiple open baths containing plating solution. In a typical operation, a wafer holder immerses a substrate wafer face down in the plating solution during plating operations. The plating solution is exposed to ambient air, especially when the substrate wafer is being moved and the wafer holder does not cover the plating bath surface. Thus, an open bath system has disadvantages. For example, during the metal deposition step, ambient oxygen is readily dissolved in the solution, and the dissolved oxygen can interfere with the desired metal deposition (e.g., by slowing or preventing metal deposition). Electroless plating operations are performed at elevated temperatures in a range of 40° C. to 90° C., typically in a range of about 50° C. to 80° C. At these temperatures, the plating solution components have a tendency to evaporate. The tendency of water and volatile components to evaporate is exacerbated by the need to ventilate the gaseous spaces over a plating bath, especially to remove explosive or toxic fumes inherent to the electroless solution (e.g., ammonia gas) or created by spontaneous decomposition of its components (e.g., dimethylamine, hydrogen). The heating load caused by evaporation substantially increases the size and costs of a heater required to maintain plating bath temperature. Condensation of evaporated bath constituents on plating-cell walls and on the wafer holder are a source of backside contamination. Subsequent crystallization of those same condensates causes other contamination problems. Maintaining bath concentration, therefore, requires complicated and expensive monitoring and control techniques. See, for example, U.S. Pat. No. 6,537,416, issued Mar. 25, 2003 to Mayer et al., and U.S. Pat. No. 6,713,122, issued Mar. 30, 2004, to Mayer et al., which are hereby incorporated by reference. A conventional electroless plating bath typically can have a bath volume of 20 liters or more. Typical bath turnover rates required to avoid plate-out and composition drift are 6 hours to 10 hours. Assuming a processing rate of 20 wafers per hour, approximately 160 wafers can be processed with 20 liters.

A problem of both face-down and face-up plating configurations is hydrogen-bubble entrapment on the plating surface and resulting defects. Hydrogen gas is created as a byproduct of almost all known electroless plating-solution reducing agents. A byproduct of most electroless plating oxidation half-reactions (i.e., the oxidation of the reducing agent) and of the self-degradation of the reducing agents is dissolved molecular hydrogen ($H_2$). As these reactions continue (i.e., plating reactions and bath-aging), the amount of hydrogen increases until the solution becomes saturated and eventually supersaturated with dissolved hydrogen. When this occurs, the formation of hydrogen gas (bubbles) is spontaneous, and occurs most readily on solid interfaces (e.g., vessel walls, wafer surfaces). Areas in which bubbles are attached to the wafer are not plated, creating defects. Therefore, it is advantageous to utilize designs that minimize the propensity for hydrogen formation, or minimize the effective bath age. United States Patent Application Publication No. 2003/0141018, by Stevens et al., published Jul. 31, 2003, teaches an electroless deposition apparatus in which a substrate support holds a substrate wafer in a face-up orientation to reduce bubble-formation and an evaporation shield is positioned over the substrate to form a gap that is filled with liquid plating solution.

Solution pH influences the reaction rate of the electroless plating process. It is often useful to utilize an alkaline pH-adjuster, for example, lithium-, sodium-, or potassium-hydroxide, but preferably ammonium- or tetramethylammonium hydroxide ("TMAH") to maintain or adjust the pH. Alkali metal pH-adjusters are inexpensive, but are often unsuitable for semiconductor applications because of their rapid diffusion into and poisoning of various device materials. Ammonium hydroxide is also inexpensive and does not generally degrade device performance, but it is volatile. Therefore, the maintenance of ammonium hydroxide concentration in a plating bath is problematic. TMAH and other analogous organic cation hydroxides do not suffer from either of these problems, but are significantly more expensive. The constituents of a semiconductor electroless plating solution, particularly the reducing agents and TMAH, can be expensive, leading to bath costs in a range of $25/liter to $100/liter. Therefore, one would like to use lower cost materials without the negative impacts. Also, the waste treatment of electroless plating solutions is complicated and expensive. A waste treatment process generally involves forced decomposition of the reducing agents, accompanied by hydrogen gas stripping and dilution. A small amount of dissolved reducing agent can spontaneously breakdown to create a large volume of hydrogen gas in a storage container (an explosive hazard), so the removal of reducing agents must be driven to completion. A plating solution must also be stripped of metal. The cost of such plating solution post-processing (including capital equipment costs) is typically in a range of $5/liter to $10/liter. Inefficient use of the plating solution, therefore, increases the cost of plating operations significantly.

Electroless plating solutions are also often inherently unstable. The instability manifests itself in auto-degradation of bath constituents and in the "plating-out" of bath metal as fine metallic particulate in the bulk solution and onto processing equipment walls, filters, and other system components.

The presence of plate-out particles also increases the number of defects in the workpieces and diminishes process yield. Generally, the instability of plating solutions increases with reducing agent concentration and with temperature, and decreases with the addition of bath "stabilizers" (e.g., oxygen, chlorine, lead, tin, cadmium, selenium, tellurium). In opposition to this trend, the initiation of electroless plating of a particular metal onto a substrate and the plating deposition rate are also proportional to reducing agent concentration and temperature, and decrease with the addition of bath stabilizers. Thus, plating-solution instability and electroless plating rate and nucleation are inherently linked in a non-advantageous manner.

Spray techniques have been suggested for electroless plating. See, for example, U.S. Pat. No. 6,065,424, issued May 23, 2000 to Shacham-Diamand et al. In such techniques, reacting plating solution is applied to a wafer surface as a spray or mist. Typically, the wafer is rotating under the spray or mist, and liquid solution is spun radially outwards. Under such conditions, it is difficult to maintain a sufficiently high and uniform reaction temperature because of the simultaneous cooling of the hot fluid by evaporation of the solvent (e.g., water). Alternatively, heating the backside of the wafer by a heated chuck is possible. Nevertheless, this requires a relatively massive element with sufficient heat capacity to maintain a globally uniform temperature over a standard 200 millimeter (mm) or 300 mm wafer. Also, the face-up base of the heating element/chuck is susceptible to chemical contamination and transfer of that contamination to the wafer backside. Furthermore, backside heating does not solve the problem of non-uniform evaporation and cooling of the bath solvent.

A wafer chuck should be capable of spinning at high revolutions per minute (rpm) to enable spin-drying. Splashing of liquid against apparatus walls and misting back onto the product surface can cause contamination of the apparatus and defects on the workpiece. Evaporation and misting of plating solution into the plating space results in substantial loss of the plating solution, and unwanted formation of volatile hazardous chemicals in the effluent.

Wet processing of isolated conductive-metal circuits connected to transistor elements in the presence of light and electrolyte often encounters a number of processing challenges. One problem is the creation of a photo-induced power source when p-n junctions in the base-circuit transistors are exposed to light. Another problem is the completion of a corrosion circuit on the surface being processed between the exposed isolated metal lines and a processing electrolytic solution. The energy of the light photons is converted to electrical energy, creating a reverse bias potential and a corrosion circuit.

Thus, liquid chemical reaction techniques, for example, immersion bath and spraying techniques, typically encounter problems such as: difficult or unsuitable control of reaction and process conditions; inability rapidly or dynamically to vary various operating conditions; inability to handle unstable reaction mixtures; accumulation of reaction byproducts; inefficient use of expensive liquid solutions; frequent wafer-handling between process steps; high capital cost of equipment for multi-step processes; and excessive use of valuable clean-room floor space.

SUMMARY OF THE INVENTION

The invention helps to solve some of the problems mentioned above by providing systems and methods for fluid treatment, particularly liquid treatment, of integrated circuit substrates using a thin fluid layer in a small volume of fluid.

A novel small-fluid-volume processing apparatus enables processing of integrated circuit wafers with high throughput and low cost of ownership. Embodiments of such an apparatus are useful for, among others: selective electroless plating of cobalt and nickel (including combinations of Co, Ni, B, P, and W using electroless process solutions); nonselective electroless plating (e.g., deposition of seed layers or the modification of vacuum-deposited seed layers by electroless copper deposition); metal etching (e.g., etching of copper, Ta, TiSN, Co, Ni, etc.); electroless (chemical) polishing (e.g., of copper); various surface treatments (e.g., copper surface reaction with benzotriazole or 3-mercapto-1-propane sulfonic acid); and cleaning and rinsing operations. In particular embodiments in accordance with the invention, a cobalt alloy is electrolessly plated onto copper material in an integrated circuit substrate. An example is a cobalt-capping layer for capping copper.

The invention is described primarily with respect to its application to electroless plating, but the invention also includes embodiments useful for other treatments of a substrate wafer surface using a small volume of fluid enclosed in a treatment space, particularly chemical liquid reaction processes and related pretreatment and post-treatment operations. For example, removal of metal layers is also conducted in accordance with the current invention.

Embodiments in accordance with the invention enable efficient use of small volumes of often unstable fluid reactants and other processing chemicals at elevated temperatures, with preferred embodiments having the ability to recycle these chemicals to reduce operating costs further.

Embodiments in accordance with the invention also provide efficient use of surface-cleaning and particle-removing chemicals and the use of minimal water for rinsing operations. Electroless (or chemical) plating, polishing, etching, and rinsing operations are conducted in accordance with the invention with a high degree of global uniformity, using a minimal amount of fluid reactant.

A small volume of treatment fluid (e.g., electroless plating solution) in accordance with the invention is enclosed in a small-volume treatment space located in a microcell container and is in fluidic contact with a treatment surface of a wafer substrate. In this specification, therefore, a small fluid-treatment volume for performing a liquid treatment of a substrate surface, or a container in which a small fluid-treatment volume is located, is sometimes referred to as a "microcell". The terms "microcell", "microcell technology", "microcell module", and related terms are also used to refer to an apparatus or method in accordance with the invention comprising a small-volume treatment fluid contained in an enclosed space of a microcell container. Typically, a treating liquid is injected into a microcell container and then a substrate carrier supporting a substrate wafer is lowered into the container to form a small fluid-treatment volume filled with liquid, though this sequence may obviously be reversed as well.

In one aspect of the invention, a small fluid-treatment volume provides control of the degree or extent of the particular treatment operation. For example, by inserting a certain volume of liquid reactant at a certain concentration at a controlled temperature into a microcell container and allowing it to remain in the container in contact with a substrate wafer for a time sufficient for a known reaction to run to completion or to an equilibrium point, a controlled known amount of material is deposited on the substrate. For example, a layer having a thickness of 50 nanometers (nm) is deposited by including a known number of moles of reactants in the small fluid-treatment volume sufficient to deposit 50 nm of material, and no more. Similarly, in an etching operation, a desired thickness of material is removed from a substrate surface by including a known number of moles of reactants in the small fluid-treatment volume and allowing them to react to completion.

In another aspect, such measured deposition, etching, or other treatment operations are conducted in a series of steps. For example, a partial electroless plating of metal is conducted, the substrate's treatment surface is examined, and then a further operation is conducted to complete metal deposition. In another aspect, a treatment is conducted in a series of steps because a single-step operation is undesirable or impossible because of the production of reaction byproducts or for other reasons. For example, in the electroless plating of cobalt on copper, oxidation of the reducing agent generates hydrogen gas. In some embodiments, since the liquid in the small fluid-treatment volume has a limited solubility of hydrogen gas, the liquid is flushed from the fluid gap and replaced with fresh reactants.

Another advantage of an apparatus and a method in accordance with the invention is that the composition of a treatment fluid and the flowrate of a treatment fluid into an enclosed treatment space of a microcell container is controllable and dynamically variable during treatment operations. In one aspect, certain processes of a substrate treatment, such as nucleation, are conducted under quiescent conditions by injecting a certain volume of reactant liquid at a particular concentration into a microcell container and allowing it to sit. In contrast, in certain other processes of some embodiments, such as in a growth phase of electroless cobalt plating, liquid reactant is continuously flowed into the treating space, generating convection in the small fluid-treatment volume.

A microcell apparatus in accordance with the invention is suitable for solving various problems related to electroless plating. In electroless plating techniques, some chemical reactant solutions are chemically unstable. In conventional plating technology, which usually relies on a bath, multiple liters of reactant liquids and other processing liquids are used. When they are unstable and they degrade, they can no longer be used. In a microcell in accordance with the invention, very small amounts of liquid are used per wafer substrate treated. A conventional immersion bath typically holds a volume of 15 liters to 20 liters. In contrast, the volume of a small fluid-treatment volume in accordance with the invention is generally in a range of about from 10 milliliters (ml) to 3500 ml, typically 25 ml to 2000 ml, and more typically 100 ml to 500 ml, depending on wafer size, process gap height, and hardware geometry.

Electroless plating involves a chemical reduction-oxidation (redox) reaction of dissolved metal ions in solution to achieve the desired metal deposition on a substrate. The chemical reaction is typically sensitive to temperature and to pH. A carrier/wafer assembly positioned proximate to the inside bottom surface of a microcell container forms a thin enclosed treatment space having a small volume. The small-volume treatment space is filled with liquid reactants or other fluid, depending on the phase of the process. The resulting small fluid-treatment volume allows temperature and pH, as well as other process variables, to be controlled and varied effectively. Among other functions, the bottom and/or sidewalls of the microcell container serve as a pre-heated "thermal mass", or "heat capacitor", that heats or cools the treatment fluid and maintains it at a desired temperature. By changing the temperature of a microcell container, the temperature of the small volume of treatment fluid is changed to a new temperature.

Embodiments in accordance with the invention also enable electroless plating in a dark environment.

In another aspect, pre-treatment, liquid chemical treatment, and post-treatment operations are conducted in the same module, or "supercell". In another related aspect, a supercell in accordance with the invention comprises a plurality of microcell containers and substrate carriers for performing multiple operations in a single microcell module.

In one aspect, a single tube or a plurality of tubes function as liquid inlet tubes into the microcell container. Typically, an inlet tube defines an inlet port located at the periphery of microcell container so that fluid is injected proximate to the periphery of the treatment space. In some embodiments, liquid treating fluid (e.g., electroless plating solution) is injected into a microcell container tilted at an angle, and then the carrier/wafer assembly is gradually lowered to form a fluid-filled enclosed treatment space. Accordingly, a leading edge of the substrate wafer penetrates the liquid surface and a liquid wetting front moves across the wafer surface as the wafer is lowered further into the microcell container until a substantially enclosed treatment space between the substrate wafer and the bottom of the container is completely filled with liquid. This alternative is useful in avoiding the formation of trapped air pockets or bubbles within a small fluid-treatment volume. Alternatively, a carrier/wafer assembly is lowered into a microcell container to form a small-volume enclosed treatment space, and then treating fluid (typically liquid) is injected through one or more inlet ports to form a small, enclosed volume of treating fluid in contact with the treatment surface of the substrate. In preferred embodiments, an apparatus includes a seal between the carrier/wafer assembly and the sidewall of the microcell container when the carrier/wafer assembly is in a lower, "treating" position forming the enclosed treatment space. An apparatus in accordance with the invention preferably includes one or more exhaust ports for venting fluid (e.g., air) as a carrier/wafer assembly is lowered into treating fluid, or as treating fluid is injected into an enclosed treatment space.

Cobalt and some other metals are magnetic. In one aspect of the invention, magnetic force is used to attract magnetic particles of cobalt (or other metal) and thereby remove cobalt-containing particulate matter from a chemical reactant liquid, from a liquid layer, or from the surfaces of a microcell apparatus. In another aspect, a magnetic field is formed in a microcell to control and focus deposition of cobalt (or other metal) onto a treatment surface. Thus, an electromagnet in a wall of the microcell container or in the substrate holder is used to enhance nucleation, growth, and selectivity. In still another aspect, the magnetic field created by cobalt deposited on a treatment surface (or other magnetic material on a substrate) is measured to determine the amount of material deposited, the thickness of the layer, thickness uniformity, and topography. This allows efficient endpoint determination. In another aspect, continuous measurement of magnetic fields created by deposited cobalt or other magnetic material enables real-time feedback and quality control.

In still another aspect, light is shown into the thin enclosed treatment space and an optical sensor measures reflectivity, spectra, or some other optical property to measure layer thickness, layer uniformity, and/or topography.

In another aspect, a thin enclosed treatment space in accordance with the invention comprises a gap, the gap typically having a gap height in a range of about from 1 mm to 5 cm and a gap volume in a range of about from 0.1 $cm^3$ per $cm^2$ of wafer treatment surface to about 5 $cm^3$ per $cm^2$ of wafer treatment surface.

An apparatus in accordance with the invention is useful for electrochemical treatments of a substrate surface, such as electroplating and electropolishing, by electrically biasing the microcell container and establishing an opposite bias on the substrate surface.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which:

FIG. 9 depicts schematically a cross-sectional view of the apparatus of FIG. 8 in which the substrate holder assembly has been moved vertically further downwards into a position in which the treatment surface has been partially wetted by electroless plating (treating) solution;

FIG. 10 depicts schematically a cross-sectional view of the apparatus of FIG. 9 in which the substrate holder assembly has been moved vertically further downwards into a "plating" (or "treating") position;

FIG. 13 contains a process flow diagram of a generalized method in accordance with the invention for conducting fluid treatment of a substrate surface using an apparatus in accordance with the invention.

DESCRIPTION OF THE INVENTION

The invention is described herein with reference to FIGS. 1-13. It should be understood that the structures and systems depicted in schematic form in FIGS. 1-12 serve explanatory purposes and are not precise depictions of actual structures and systems in accordance with the invention. Furthermore, the embodiments described herein are exemplary and are not intended to limit the scope of the invention, which is defined in the claims below.

The terms "fluid treatment", "treatment", and related terms are used in a broad sense in this specification to designate any treatment of an integrated circuit substrate using liquid and/or gas phases, including, for example, pre-treatment operations, cleaning techniques, liquid chemical reactions, rinsing, drying, and post-treatment operations. The term "liquid chemical reaction treatment" is also used in a narrower sense and refers to a treatment conducted at the treatment surface of an integrated circuit substrate involving chemical reaction; for example, deposition, etching, and polishing operations. Broad categories of chemical liquid reaction treatments include electroless metal plating, electroless etching, electrolytic plating, electrolytic etching, metal-oxide deposition, and liquid dielectric deposition.

The term "dynamically variable" and related terms means that a variable or parameter of an apparatus, method, or composition is variable during a treatment process.

Figure 1:
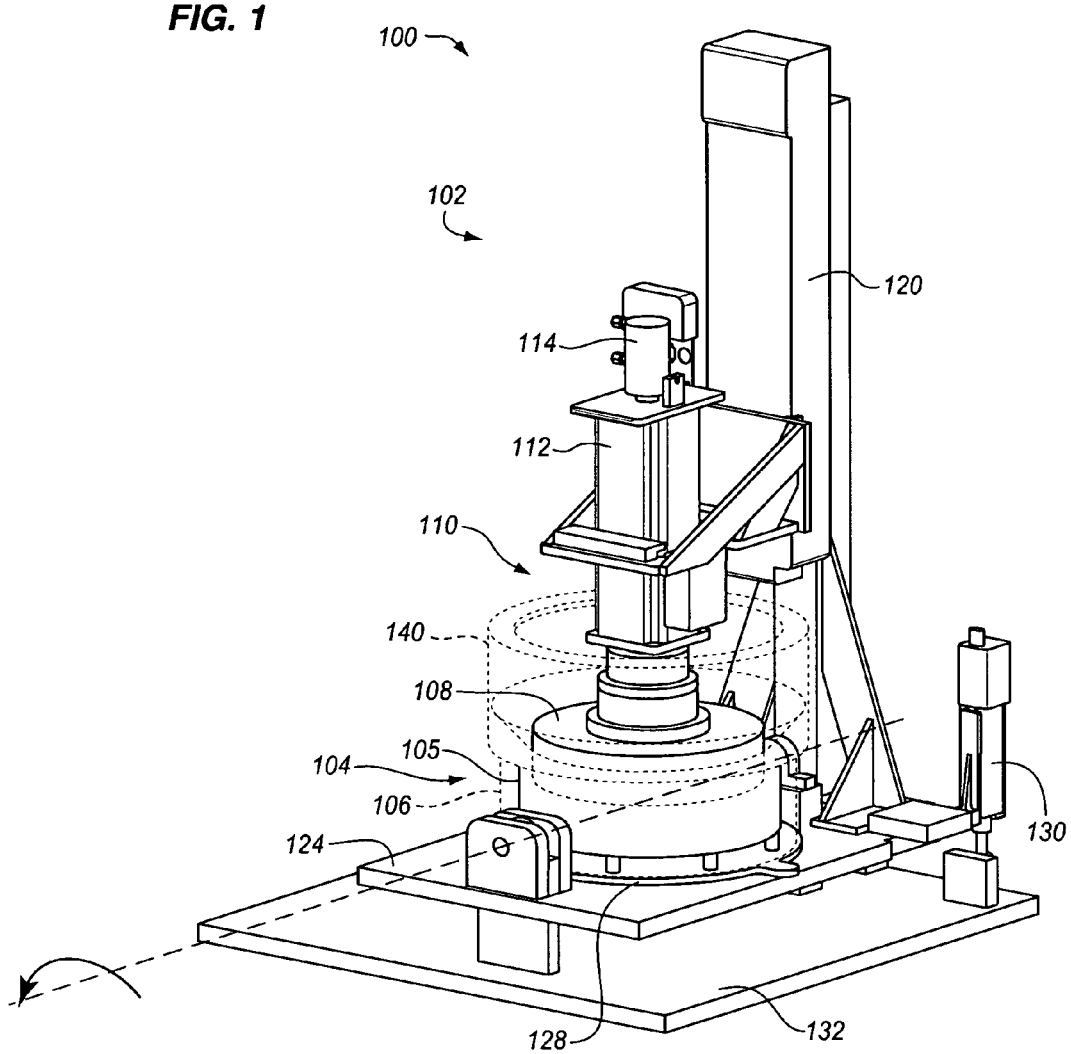
FIG. 1 depicts a perspective view of a microcell apparatus in accordance with the invention for conducting a fluid treatment, particularly a chemical liquid reaction treatment, using a small fluid-treatment volume.

FIG. 1 depicts a perspective view 100 of a microcell apparatus 102 in accordance with the invention for conducting a fluid treatment, particularly a chemical liquid reaction treatment, using a small fluid-treatment volume. Microcell apparatus 102 comprises a heated microcell unit 104. Microcell unit 104 includes a microcell container 105 and an outer-perimeter thermal insulator 106 surrounding the cylindrical sidewall of the container. Microcell apparatus 102 further comprises a substrate carrier 108 for holding a substrate wafer. Substrate carrier 108 is part of substrate holder assembly 110. Substrate holder assembly 110 includes a rotation drive 112 for rotating substrate carrier 108. Substrate holder assembly 110 further includes a rotary union 114, which accommodates conduits for vacuum and pressurized clean air or nitrogen. Substrate carrier 108 preferably provides a barrier to heat leaving through the backside of a substrate wafer. Some embodiments (not shown) include slip rings proximate to rotation drive 112 to help provide electrical power for heating a substrate carrier. Microcell apparatus 100 further includes a vertical lift 120 for translating rotation drive 112 and substrate carrier 108 into and out of heated microcell unit 104. Preferably, vertical lift 120 provides tailored motion profiles to mitigate splashing, bubbles and other problems typically encountered during immersion of a substrate wafer into wet chemistry. Microcell apparatus 102 further comprises tilt table 124 on which microcell unit 104 is mounted via mounting plate 128. Vertical lift 120 and thereby substrate holder assembly 110 are also mounted on tilt table 124. A tilt actuator 130 is mounted on a horizontal base plate 132 and is functionally connected to tilt table 124. Various embodiments of devices suitable for serving as a tilt actuator are known in the art. As depicted in FIG. 1, tilt actuator 130 is spring-assisted and is typically capable of tilting tilt table 124 to an angle in a range of about from zero to 20° (though any desired angle, to include a negative value, may be obtained), thereby tilting microcell unit 104, substrate holder assembly 110 and vertical lift 120 at the same angle. FIG. 1 also depicts rinse shield 140 located substantially above microcell unit 104.

Figure 2:
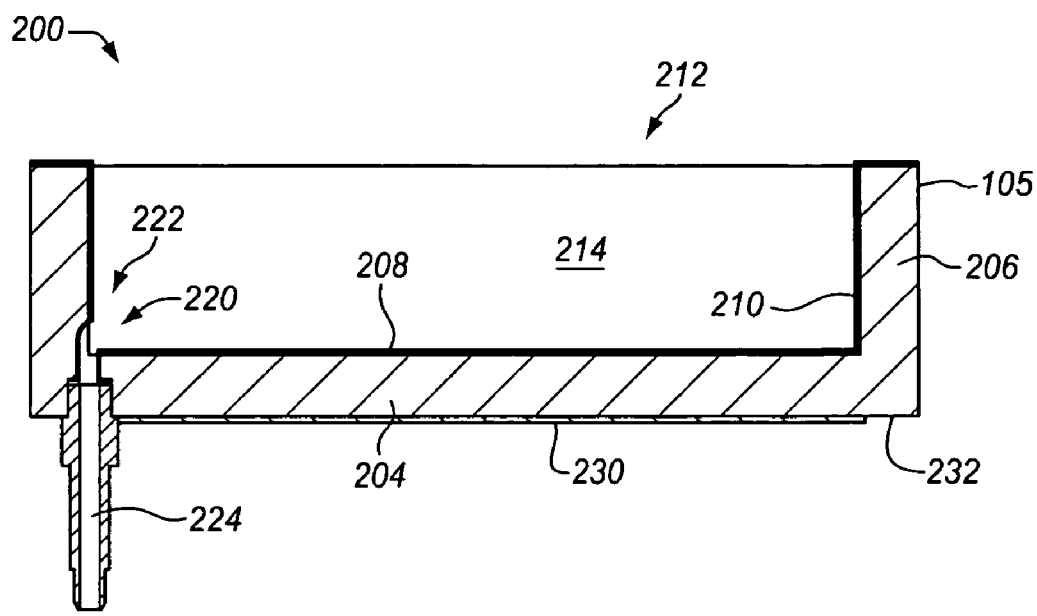
FIG. 2 depicts schematically a cross-sectional view of a microcell container in accordance with the invention.

FIG. 2 depicts schematically a cross-sectional view 200 of a microcell container 105 in accordance with the invention. Microcell container 105 comprises a bottom wall 204 and a cylindrical sidewall 206. Bottom wall 204 comprises an inside bottom surface 208. Cylindrical sidewall 206 comprises an inside sidewall surface 210. Microcell container 105 further comprises a top opening 212. Inside bottom surface 208, inside sidewall surface 210, and top opening 212 define container space 214. Fluid port 220, typically located in the peripheral region 222 of container space 214, provides fluidic connection between an inlet tube 224 and container space 214. Typically, fluid port 220 comprises a conduit through one or both of bottom wall 204 and sidewall 206 proximate to bottom 208 of container space 214. As depicted in FIG. 2, a thick-film heater 230 covers a substantial portion of outside bottom surface 232 of bottom wall 204. Thick film heaters suitable for covering outside bottom surface 232 and for heating microcell container 105 are known in the art. Other suitable heaters are also known in the art. Some embodiments include a zoned heater 230 for delivering heat at different rates to different portions of bottom wall 204. Some embodiments include one or more additional heaters used for providing a uniform temperature profile in the walls of microcell container 105. For example, some embodiments include an additional side-edge heater or zoned heater to perturb a substrate-edge temperature purposely and thereby promote edge plating-thickness uniformity.

In another aspect, a microcell container is heated and maintained at an elevated temperature by one or a plurality of means. In some embodiments, an electrical heating element is embedded into walls of a microcell container. The temperature is controlled by a regulator that senses the container's temperature via thermocouple, thermistor, or similar device embedded in the bulk of a container wall. Alternatively, a heat exchange manifold with a high-surface-area fluid path interfaces with flow of an externally temperature-controlled head-exchange fluid.

Microcell container 105 comprises a significant mass of a highly conducting material with a heat capacity substantially greater than that of a substrate wafer. Generally, the total (not specific) heat capacity of the microcell container is designed to be more than 10 times greater than that of a substrate, and the thermal conductivity of the heating mass in the container walls is designed to be high, generally greater than 0.2 Watt $cm^{-1} K^{-1}$. Examples of suitable head container materials are metals such as Copper (Cu), Aluminum (Al), Titanium, stainless steel, and Iron, particularly Aluminum and Copper.

An exemplary microcell container has a bottom wall thickness and a sidewall thickness of 2.5 cm. A microcell container typically is designed to treat a substrate wafer having a particular diameter. The container space of a microcell container usually is designed to have an inside diameter about 3 cm greater than the diameter of a wafer to be treated. The container space 214 of an exemplary microcell container designed to treat a 300 mm wafer has an inside diameter of about 33 cm and an inside sidewall height of 8 cm. Accordingly, the inside diameter of a sidewall 206 of an exemplary microcell container designed to treat a 300 mm wafer has an inside diameter of about 33 cm In a typical electroless process, over time the plating metal tends to plate onto any available metal surface. The ease of initiation of the plating depends on a number of variables, including roughness, surface oxides, metal catalytic reactivity with the reducing agent, and metal ion reduction charge-transfer resistances. Therefore, the presence of exposed metal surfaces in a microcell container or of a substrate carrier is potentially problematic. Nevertheless, it is generally desirable to use metal because metals provide high thermal conductivity. Therefore, to avoid undesired plating of plating metal onto a metal surface of a microcell apparatus, in certain embodiments the exposed surfaces of a container, substrate carrier and other elements are covered with a plastic film. Typically, the plastic film has a thickness of about 1 mm or less to minimize interference with heat exchange between the microcell-container walls and the small fluid-treatment volume. As depicted in FIG. 2, inside bottom surface 208 and inside sidewall surface 210 comprise a pin-hole free plastic coating, such as Teflon/PFA. Other suitable materials would include ECTFE (Halar), PVDF, Polypropylene, or others.

Figure 3:
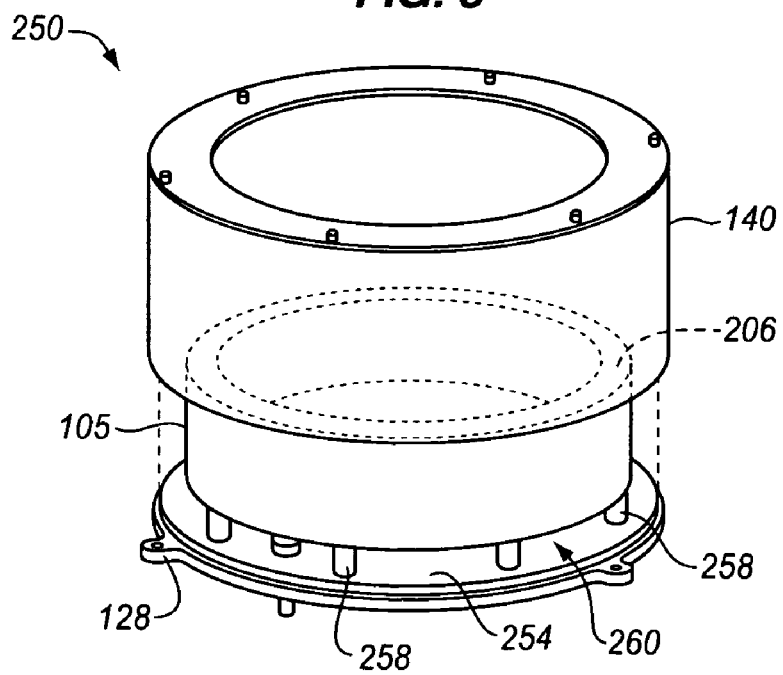
FIG. 3 depicts a perspective view of a microcell container mounted on a mounting plate, and of a rinse shield above the container.

FIG. 3 depicts a perspective view 250 of a microcell container 105 mounted on a mounting plate 128. Preferably, mounting plate 128 is thermally insulated. In some embodiments, mounting plate 128 comprises thermally insulating material. In other embodiments, as depicted in FIG. 3, mounting plate 128 comprises mounting-plate thermal insulator 254, typically made from ceramic thermal-insulator material. As depicted in FIG. 3, microcell container 105 is mounted to mounting plate 128 via a plurality of mounting studs 258, which support microcell container 105 above mounting plate 128. Preferably, mounting studs 258 comprise thermally insulating material, such as ceramic thermal insulators. The bottom of microcell container 105 supported above mounting plate 128 forms bottom-insulating space 260. Bottom-insulating space 260 is typically occupied by air. In some embodiments, bottom-insulating space 260 is filled with thermally non-conductive material. In other embodiments, space 260 may be occupied by forced gas at a (dynamically) controlled temperature. FIG. 3 also depicts rinse shield 140. Rinse shield 140 is located substantially above microcell container 105.

Figure 4:
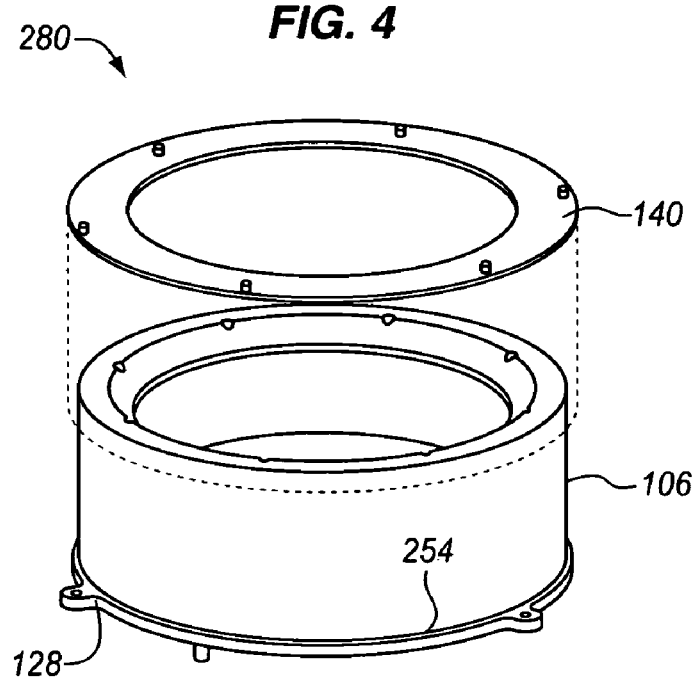
FIG. 4 depicts a top perspective view of an outer-perimeter thermal insulator surrounding a sidewall of a microcell container.

FIG. 4 depicts a top perspective view 280 of outer-perimeter thermal insulator 106 surrounding sidewall 206 (as shown in FIG. 2) of microcell container 105 (as depicted in FIGS. 2-3). Preferably, outer-perimeter thermal insulator 106 comprises thermally insulating material. In preferred embodiments, outer-perimeter thermal insulator 106 and sidewall 206 define an annular side-insulating space, which is typically occupied by air or other thermally non-conductive material. Rinse shield 140 is located above microcell container 105. Outer-perimeter thermal insulator 106 is supported on mounting-plate thermal insulator 254 of mounting plate 128.

Figure 5:
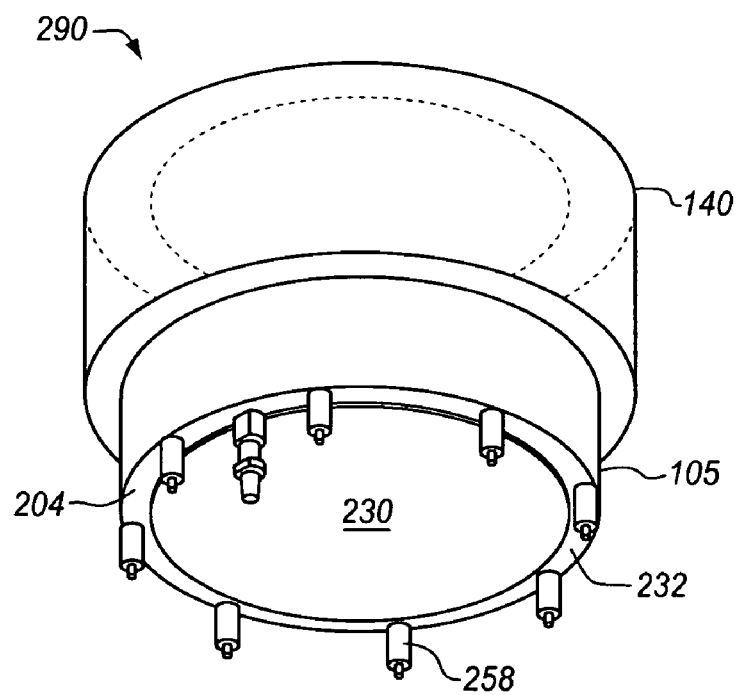
FIG. 5 depicts a bottom perspective view of the outside bottom surface of a microcell container, including a thick-film heater.

FIG. 5 depicts a bottom perspective view 290 of outside bottom surface 232 of microcell container 105, including thick-film heater 230 covering a substantial portion of bottom surface 232. FIG. 5 also depicts ceramic supporting studs 258 mounted to bottom wall 204 of microcell container 105. Rinse shield 140 is located above microcell container 105.

Figure 6:
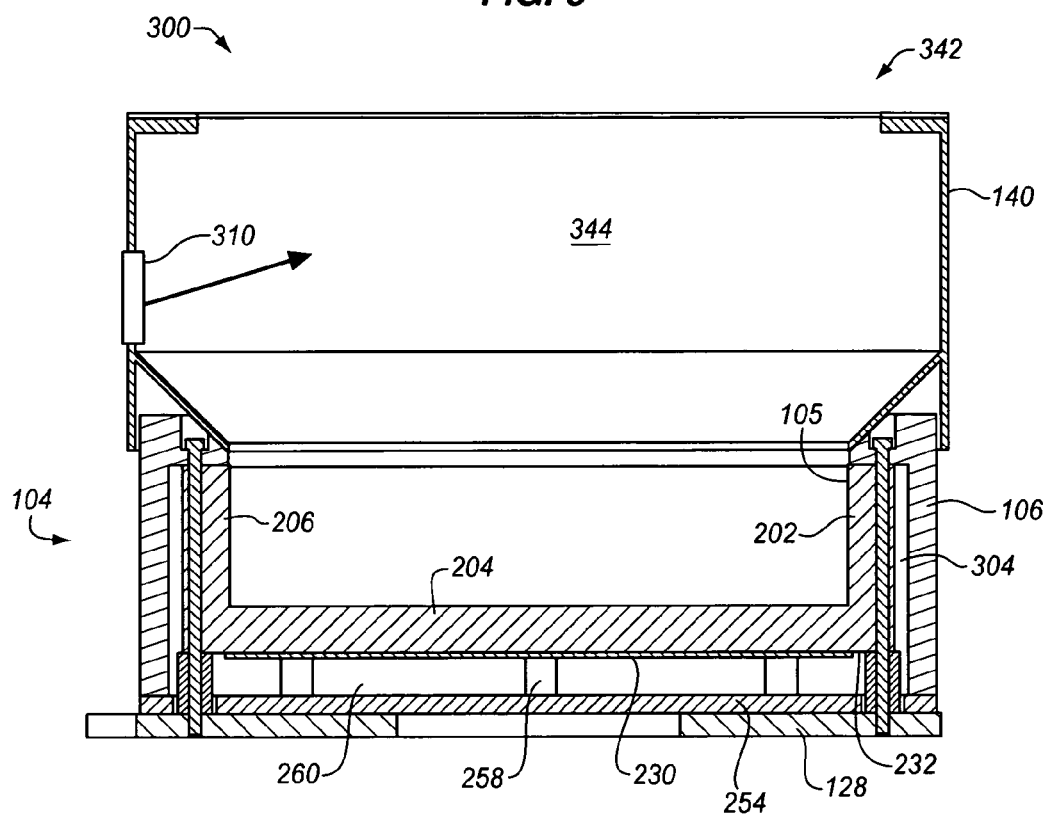
FIG. 6 depicts schematically a cross-sectional view of a microcell unit comprising an outer-perimeter thermal insulator and a microcell container on a mounting plate.

FIG. 6 depicts schematically a cross-sectional view 300 of microcell unit 104 comprising outer-perimeter thermal insulator 106 and microcell container 105 on mounting plate 128. Mounting plate 128 comprises mounting-plate thermal insulator 254. Microcell container 105 is mounted to mounting plate 128 via ceramic thermally-insulating mounting studs 258. FIG. 6 depicts thick-film heater 230 located on outside bottom surface 232 of microcell container 105. A bottom-insulating space 260 is located between bottom wall 204 of microcell container 105 and mounting plate 128. Annular side-insulating space 304 is located between sidewall 206 of microcell container 105 and outer-perimeter thermal insulator 106. FIG. 6 further depicts rinse shield 140 located substantially above microcell unit 104. FIG. 6 further depicts a variable-angle nozzle 310 for directing rinsing or cleaning fluid at a substrate (not shown) having a treatment surface. During rinsing or cleaning operations, a substrate being held in a substrate carrier (not shown) substantially closes top opening 342 of rinse shield 140, which defines a rinse space 344.

FIGS. 7-12 depict schematically an apparatus 102 during various stages of a fluid treatment process conducted in accordance with the invention. FIGS. 7-12 are discussed herein with reference to electroless plating operations. It is understood, however, that an apparatus 102 is suitable for other types of fluid treatment of substrates.

Figure 7:
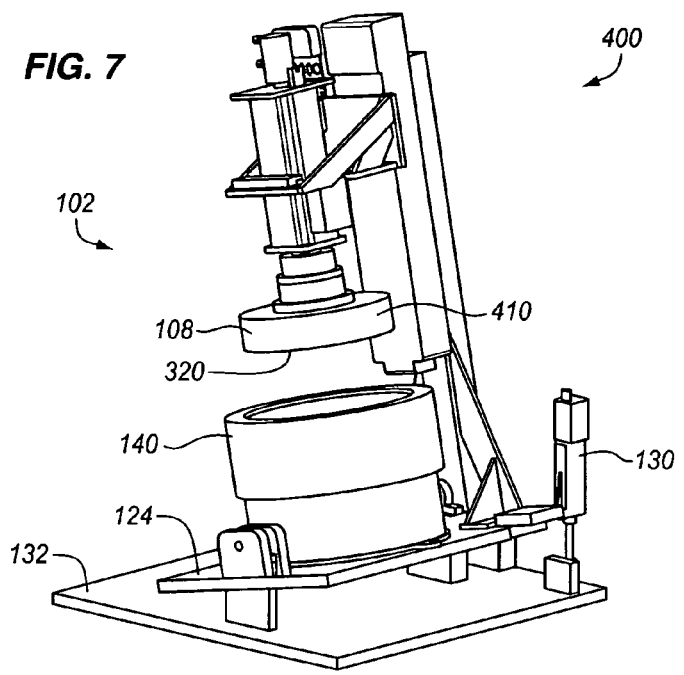
FIG. 7 depicts schematically a perspective view of a microcell apparatus in which a tilt table has been tilted at an angle to the horizontal base plate.

FIG. 7 depicts schematically a perspective view 400 of a microcell apparatus 102 in which tilt table 124 has been tilted at an angle to horizontal base plate 132. A substrate wafer (indicated by reference numeral 320) has been previously loaded using conventional techniques into substrate carrier 108, thereby forming carrier/wafer assembly 410. Generally, a wafer is transported horizontally and loaded into substrate carrier 108 when apparatus 102 has an un-tilted horizontal orientation. FIG. 7 depicts carrier/wafer assembly 410 above rinse shield 140 in an "up" (or raised) wafer-loading position.

Figure 8:
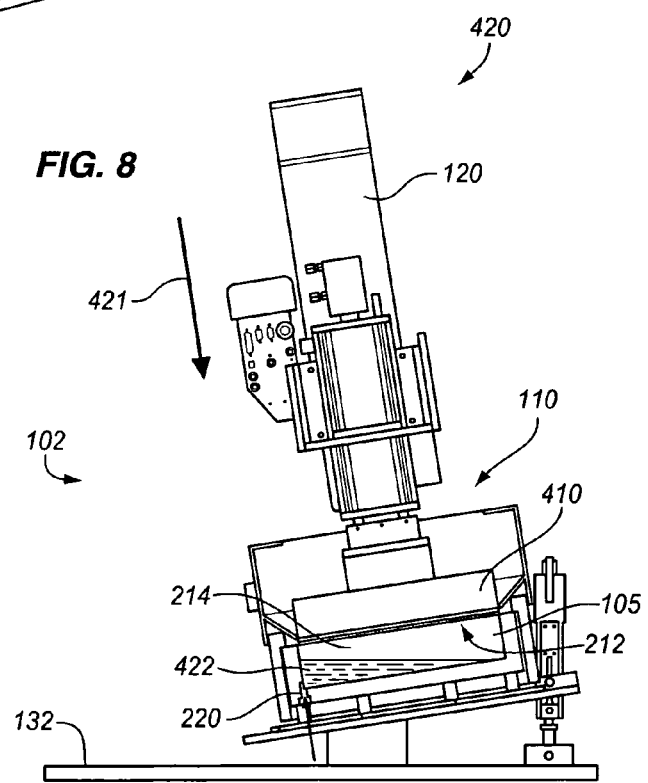
FIG. 8 depicts schematically a cross-sectional view of the apparatus of FIG. 7 in which the substrate holder assembly has been moved vertically downwards using a vertical lift into a "fill" position.

FIG. 8 depicts schematically a cross-sectional view 420 of apparatus 102 in which substrate holder assembly 110 has been moved vertically downwards indicated by arrow 421 using vertical lift 120 into a "fill" position. Generally, in a fill position, carrier/wafer assembly 410 is located proximate to top opening 212 of microcell container 105 so that carrier/wafer assembly 410 substantially closes top opening 212. As depicted in FIG. 8, liquid electroless plating solution 422 has been injected into microcell container space 214 through fluid port 220. As depicted in FIG. 8, liquid treatment fluid 422 generally does not fill container space 214 completely. Instead, only an amount of liquid 422 corresponding to the desired fluid-treatment volume is injected into microcell container space 214.

FIG. 9 depicts schematically a cross-sectional view 430 of apparatus 102 in which substrate holder assembly 110 has been moved vertically further downwards indicated by arrow 431 using vertical lift 120 into a position in which wafer treatment surface 322 of substrate wafer 320 has been partially wetted by electroless plating solution 422. Because apparatus 102 is in a tilted orientation, wetting of wafer treatment surface 322 begins at a wafer edge 432 as carrier/wafer assembly 410 is gradually lowered into microcell container 105. As carrier/wafer assembly 410 is lowered further, a substantially linear wetting front 434 progresses across wafer treatment surface 322 (from left to right in view 430 of FIG. 9) until wafer treatment surface 322 is completely wetted, as depicted in FIG. 10.

FIG. 10 depicts schematically a cross-sectional view 440 of apparatus 102 in which substrate holder assembly 110 has been moved vertically further downwards indicated by arrow 441 into a "plating" (or "treating") position using vertical lift 120. Alternatively, in some embodiments (not depicted here), the microcell container is movable into a treating position. Carrier/wafer assembly 410 forms a thin enclosed treatment space 442 defined by carrier/wafer assembly 410 (including wafer treatment surface 322), by inside bottom surface 208 of container wall 204, and by inside sidewall surface 210 of container sidewall 206. Thin enclosed treatment space 442 comprises a substantially vertical gap between carrier/wafer assembly 410 and inside bottom surface 208. The vertical gap typically has a gap height in a range of about from 1 mm to 5 cm. Thin enclosed treatment space 442 is filled by treatment volume 444 of liquid 422. Thin enclosed treatment space 442 and corresponding treatment volume 444 generally comprise a volume in a range of about from 25 ml (milliliter) to 2000 ml, more typically in a range of about from 100 ml to 500 ml. Apparatus 102, including microcell container 105 and carrier/wafer assembly 410, is depicted in FIG. 10 in a tilted orientation. In some embodiments, liquid treatment (e.g., electroless plating) is conducted while apparatus 102 is in a tilted orientation. In other embodiments, liquid treatment is conducted while apparatus 102 is in a horizontal orientation as depicted in FIG. 1.

Figure 11:
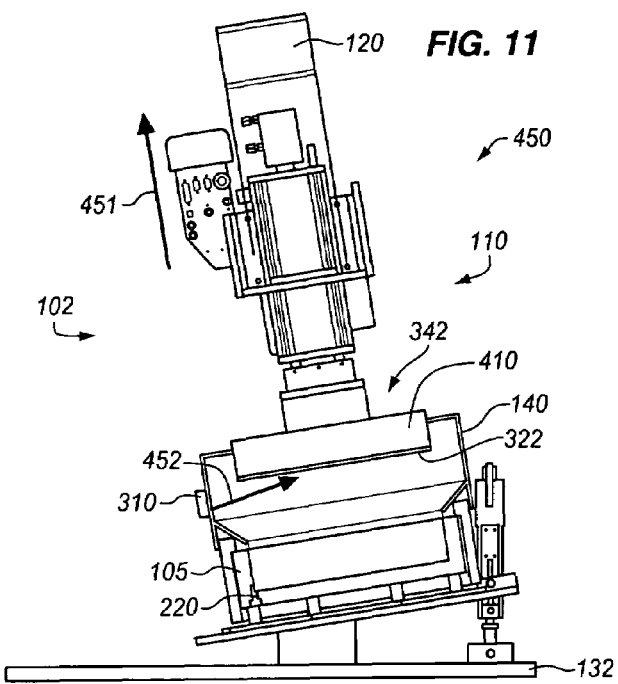
FIG. 11 depicts schematically a cross-sectional view of the apparatus of FIG. 10 in which the substrate holder assembly has been moved vertically upwards into a "rinse" position.

FIG. 11 depicts schematically a cross-sectional view 450 of apparatus 102 in which substrate holder assembly 110 has been moved vertically upwards, indicated by arrow 451, using vertical lift 120 into a "rinse" position in which carrier/wafer assembly 410 is located proximate to top opening 342 of rinse shield 140 and substantially closes top opening 342. FIG. 11 shows that plating liquid has been drained out of microcell container 105, typically through fluid port 220. FIG. 11 further shows rinsing liquid, for example, deionized water or other cleaning solution, being sprayed, as indicated by arrow 452, from variable nozzle 310 onto substrate treatment surface 322.

Figure 12:
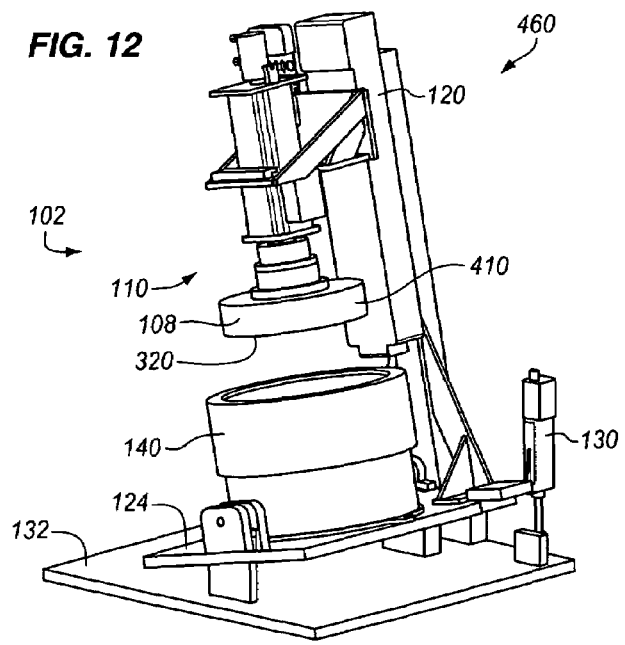
FIG. 12 depicts schematically a perspective view of the apparatus of FIG. 11 in which the substrate holder assembly has been moved further vertically upwards into an "unload" position.

FIG. 12 depicts schematically a perspective view 460 of apparatus 102 in which substrate holder assembly 110 has been moved further vertically upwards using vertical lift 120 into an "unload" position in which carrier/wafer assembly 410 is located above rinse shield 140. Generally, tilt actuator 130 is thereafter used to move tilt table 124 into a horizontal orientation so that the substrate wafer (indicated by reference 320) can be unloaded from substrate carrier 108 in a horizontal orientation.

In one aspect, pre-wetting and cleaning of the treatment surface is conducted before plating or other chemical liquid reaction treatment. For example, exposing the treatment surface with an activator solution prior to nucleation is conducted using a small fluid-treatment volume in the fluid gap, or alternatively by spraying or otherwise rinsing the treatment surface.

In this specification, terms of orientation, such as "face-down", "above", "below", "up", "down", "top", "bottom", and "vertical" used to describe embodiments relate to the relative directions in FIGS. 1 and 7-12 in which a horizontal base plate 132 defines a substantially horizontal plane. It is understood, however, that the spatial orientation of substrates and apparatuses in embodiments in accordance with the invention are not confined to those depicted in the drawings.

The term "enclosed treatment space" and related terms is used broadly to designate a treatment space in a container that is substantially enclosed. For example, in preferred embodiments, a carrier/wafer assembly creates a seal with the sidewalls of microcell container. In other embodiments, a fluid-tight seal is not established, but the carrier/wafer assembly effectively inhibits evaporation or other undesired escape of liquid present in the treatment space.

The term "face-down" and related terms generally refers to the orientation of a treatment surface of a substrate wafer relative to a horizontal plane. In a narrow sense, face-down means that the treatment surface of a wafer is horizontal and facing vertically downwards. Because embodiments in accordance with the invention enable tilting a microcell container and a substrate carrier, the terms "face-down", "substantially face-down" and related terms mean that a line perpendicular to a treatment surface of the wafer makes an angle less than 90° relative to the vertically downwards direction, generally less than 45°, and preferably less than 20° relative to vertical.

The term "inject fluid" and related terms used with respect to flowing a fluid such as an electroless plating solution into a thin enclosed treatment space in this specification are used broadly to refer to several different types of fluid-flowing operations. In one sense, flowing liquid or gas into a microcell container means simply injecting fluid into the container. Then, after a small fluid-treatment volume has been formed, the flow of liquid into the thin fluid gap ceases. Alternatively, fluid continues flowing at the same flow rate or continues at a different flow rate. In a second sense, therefore, flowing liquid into a thin fluid gap means continuously flowing liquid, either at steady-state or at an unsteady state, into a thin enclosed space and out of the space at a corresponding flow rate. It is a feature of some embodiments in accordance with the invention that a fluid treatment can be conducted by injecting fluid into a container and forming a small fluid-treatment volume, and then ceasing flow for a period of time, thereby conducting essentially a batch operation. On the other hand, continuous flow operations are conducted in some embodiments.

FIG. 13 contains a process flow diagram of a generalized method 500 in accordance with the invention for conducting fluid treatment of a substrate surface using an apparatus in accordance with the invention. Although method 500 is described with reference to microcell apparatus 102 depicted in FIGS. 1-12, it is understood that methods in accordance with the invention are conducted in other embodiments of an apparatus in accordance with the invention different from apparatus 102.

Processes 510 include loading a substrate wafer into a substrate carrier such as substrate carrier 108 in a load position, as depicted in FIG. 7. Typically, loading of a wafer into substrate carrier is conducted while the substrate carrier is in a horizontal orientation to accommodate conventional wafer-transporting tools.

Processes 520 include using tilt actuator 130 to moved tilt table 124 from a horizontal orientation to an angled (tilted) orientation, typically to an angle in a range of about from 5° to 15°, as depicted in FIG. 7.

Optional processes 530 include moving carrier/wafer assembly 410 into a position corresponding to the rinse position depicted in FIG. 11, at which pretreatment involving spraying of liquids is conducted within a rinse space 344 (see FIG. 6).

Processes 540 include injecting treating liquid 422, such as electroless plating solution, into microcell container 105, as depicted in FIG. 8.

Processes 550 include moving carrier/wafer assembly 410 towards a treating position, as depicted in FIG. 9, in which the carrier/wafer assembly substantially closes top opening 212 (see FIG. 2) of microcell container 105, thereby forming a thin enclosed treatment space 442 (see FIG. 10). As depicted in FIG. 9, moving carrier/wafer assembly 410 downward in a tilted apparatus results in immersion of a side edge 432 of wafer 320 into the treatment liquid, followed by progression of a wetting front 434 across substrate surface 322. Lowering carrier/wafer assembly 410 in this manner enhances wetting of substrate surface 322 and inhibits undesired formation of bubbles on substrate surface 322. In some embodiments, processes 550 include a program of translation speeds and rotational speeds, similar to the teachings in co-owned U.S. Pat. No. 6,551,487, issued Apr. 22, 2003, to Reid et al., and in co-owned and co-pending U.S. patent application Ser. No. 10/915,865, filed Aug. 11, 2004, by Varadarajan, et al., which are hereby incorporated by reference. Carrier/wafer assembly 410 is moved to a final treating position, as depicted in FIG. 10, thereby forming liquid-filled thin enclosed treatment space 442. In preferred embodiments, in processes 550, tilt table 124 (and thereby microcell container 105 and carrier/wafer assembly 410) is moved at a controlled rate from a tilted orientation to a horizontal orientation as carrier/wafer assembly 410 is gradually lowered and substrate surface 322 is concurrently and gradually immersed in treating liquid 422. This reduces the amount of undesired splashing of treating liquid as wafer surface 322, which is typically being rotated during lowering, is immersed in liquid. Thus, in preferred embodiments, tilt table 124, microcell container 105 and carrier/wafer assembly 410 of apparatus 102 are in a substantially horizontal orientation, as depicted in FIG. 1, after lowering of carrier/wafer assembly 410 has been completed in processes 550. The horizontal orientation also minimizes the volume of treating solution required to form thin liquid layer 422 because any empty space between the sidewall of microcell container 105 and carrier/wafer assembly 410 does not fill with liquid.

In processes 555, liquid treating operations proceed in thin enclosed treatment space 442 (FIG. 10) in either a tilted orientation (FIG. 10) or in a preferred horizontal orientation, as depicted in FIG. 1. As is explained above, in some embodiments, processes 555 include dynamically varying treatment conditions. For example, some embodiments include varying the temperature. Some embodiments include continuously or intermittently flowing fresh treatment liquid or treatment liquid having various compositions into enclosed space 442.

In processes 560, after liquid treatment, carrier/wafer assembly 410 generally is moved upwards to a rinse position, as depicted in FIG. 11, at which treatment surface 322 is rinsed with deionized water and/or cleaned with cleaning fluid.

Processes 570 include moving carrier/wafer assembly 410 upwards to the load/unload position, as depicted in FIG. 12.

In processes 580, carrier/wafer assembly 410 and other elements of apparatus 102 are moved from a tilted orientation back to horizontal for unloading and re-loading a substrate wafer.

It is understood that processes 510-580 can be conducted in sequences different from the order presented here. For example, in some embodiments, processes 520 of tilting apparatus 102 are conducted after processes 540 of injecting treating liquid into the microcell container. It is also understood that processes 510-580 may be conducted with the exclusion of selected steps or inclusion of extra steps; for example, microcell container 105 may be rinsed between subsequent wafers by refilling with a rinse chemical, such as deionized water.

During electroless plating of cobalt, the pH often tends to drift. For example, in some embodiments, a liquid plating solution contains an ammonium ion and the solution is heated to an elevated temperature. In aqueous solutions, the ammonium ion is in equilibrium with the amount of dissolved ammonia gas by the chemical equilibrium:

$$NH_4^+ + OH^- \leftarrow \rightarrow NH_{3(dissolved\ gas)} + H_2O.$$

Since warm dissolved ammonia gas has a relatively high partial vapor pressure, it tends to evaporate very quickly into any air above the bath. Continual or continuous adjustment of pH and other liquid properties is done with a multiple chemistry flow capability by which chemical constituents of a reactant solution are contained in a plurality of reactant liquid sources, and the flow rate from one or a plurality of liquid sources into the thin enclosed treatment space is dynamically variable.

In another aspect, the chemical composition of a plating solution is varied during plating operations so that the chemical composition of the deposited metal layer varies spatially within the layer. Such a structure may alternatively be viewed as a multilayer structure. For example, phosphor, tungsten, or boron are known to improve the barrier properties of cobalt. In accordance with certain aspects of the invention, a particular cobalt alloy is deposited at the bottom of a capping layer, a different cobalt alloy is formed for the bulk of the capping layer, and a third cobalt alloy provides the top of a capping layer.

In still another aspect, modules comprising microcell (small fluid-treatment volume) devices in accordance with the invention are stacked substantially vertically. This enables higher throughput of substrates per unit surface area of manufacturing floor space. Since pre-treating, rinsing, and posttreating operations are performed in a single or in a plurality of microcells in accordance with the invention, utilization of production space improves.

Although embodiments in accordance with the invention are described herein mainly with respect to electroless plating techniques, it is clear that apparati and methods in accordance with the invention are useful for many types of wet substrate treatments. Various substrate treatments include liquid chemical reactions as well as non-reactive treatments (e.g., pre-treatment cleaning and rinsing). In an important aspect of the invention, a plurality of substrate treatments of a substrate are conducted sequentially in one module or supercell. An example of a liquid chemical reaction treatment is the uniform etching of a substrate surface. Another example is the stripping of an oxide from a substrate surface. For example, a protective oxide layer or an oxide layer that simply formed in an oxidizing environment is stripped off before electroless plating operations begin. In another aspect, metal particles and other contaminants are cleaned from a substrate carrier, inside container walls, and other surfaces prior to liquid chemical reaction treatment. An advantage of using a microcell or supercell apparatus in accordance with the invention is that the process conditions are closely controlled and dynamically variable. Similarly, the composition of the liquid plating solution is dynamically variable. Another advantage is that many or all of the pretreatment, rinsing, drying and other process operations are conducted in a supercell in accordance with the invention.

Electroless plating is an autocatalytic plating technique. The process physics enable selective deposition of a metallic coating by a controlled chemical reduction that is catalyzed on the metal or alloy being deposited. Electroless plating depends on the action of a chemical reducing agent in solution to reduce metallic ions to the metal. Unlike a homogeneous chemical reduction, the plating reaction takes place only on "catalytic" surfaces rather than throughout the plating solution. The process occurs by the simultaneous reduction of metal and the oxidation of a "reducing agent" on the metal surface. These two processes do not have to occur at exactly the same place on the metal surface, but there must be an electrical path between the location of the reducing agent's oxidation (generating excess electrons) and the location of metal deposition (combining the generated electrons with metal ions). Electroless plating has been used for depositing a large number of materials, including Cu, Ni, Co, Fe, Pd, Pt, Ru, Rh, Au, Ag, Sn, Pb, as well as alloys containing these metals, plus Mn, Mg, W, P and/or B. Various metals are deposited electrolessly onto an electronic component, including, for example, copper, nickel, cobalt, gold, silver, palladium, platinum, rhodium, cobalt, tungsten phosphorous, and combinations thereof. Electroless polymerization is performed by an analogous electroless process for some conductive polymers (e.g., polyanaline). Typical chemical reducing agents include ammonium hypophosphite ($(NH_4)H_2PO_2$), formaldehyde ($CH_2O$), hydrazine, borohydride, dimethylamine borane (DMAB), glyoxylic acid, redox-pairs (e.g., Fe(II)/Fe(III)) and derivatives of these. A chemical reducing agent in plating solution is a source of electrons for the reduction of a metal ion to a deposited metal atom on the surface:

$$M^{n+} + ne = M^0$$

where $M^{n+}$ represents a reducible metal ion in the solvent (typically water). Complexing agents (e.g., acetate, succinate, malate, malonate, citrate, etc.) are often used in plating solutions to enhance solubility at pH values where the metal ion would otherwise be insoluble. Complexation of the metal is also useful for shifting the potential of deposition to obtain desirable conditions for deposition.

In some cases, a particularly strong and catalytically-active reducing agent is important at the beginning of an electroless plating process in order to initiate plating of the metal onto the substrate surface. This is even more important in cases where the initiation of the plating process is on a foreign metal surface (e.g., initiation of cobalt electroless deposition onto a copper surface).

Accordingly, some embodiments in accordance with the invention involving electroless plating on a foreign substrate (e.g., cobalt on copper) comprise a two-phase process including a nucleation phase and a growth phase. In the nucleation phase, a desired depositing metal (e.g., cobalt) is caused to deposit on a foreign metal substrate surface (e.g., copper). Afterwards, in the growth phase, the desired metal (e.g., cobalt) grows on a film of similar metal (e.g., cobalt). Typically, optimum or idealized process conditions for the nucleation phase are different from those of the growth phase. For example, for electroless plating of cobalt on copper, the optimal set of conditions for the nucleation reaction to occur is very different from that of the growth reaction. Nucleation of cobalt onto a copper substrate involves the generation of excess reduced cobalt-metal atoms at the copper surface at a sufficient concentration for formation of a nucleation layer of cobalt. To create this concentration of surface cobalt atoms, a reducing agent of sufficient strength (i.e., an agent having suitable free-energy driving-force and kinetics) to reduce sufficient metal ions at a sufficiently rapid rate is required. One example of such a reducing agent is mopholine borane. Because the process of cobalt-ion reduction is likely stepwise, the creation of partially-reduced surface-absorbed metal ions presents a problem. The partially-reduced ions can diffuse away into the electrolyte and not aid in the nucleation process. To minimize this possibility, initiation of the electroless plating operation during a nucleation phase is typically performed under stagnant conditions. If the wafer were spinning quickly, rapid vigorous fluid flow would prevent the partially-reduced cobalt ions from accumulating, and nucleation would slow or not occur. On the other hand, once nucleation has occurred, the kinetics of the reducing-agent oxidation and cobalt reduction are quite different. It is believed that cobalt grows on cobalt in a more rapid, virtually single-step reduction reaction, and fluid convection caused by a high rotational speed enhances mass transfer and deposition rates. Furthermore, the kinetics of the reducing agent (e.g., morpholine borane) are substantially slower on the cobalt surface than on copper. Therefore, during the cobalt growth phase, a different set of chemical (composition and concentration of reducing agents) and physical (e.g., temperature, rotation rate) conditions are desirable.

Thus, in one aspect of the invention, a method for electroless plating of a cobalt alloy on copper comprises two distinct process phases, nucleation and growth, which are conducted separately under different process conditions, usually with different process chemistry. Typically, a third phase, activation, precedes nucleation. Co-owned and copending U.S. patent application Ser. No. 10/609,518, filed Jun. 30, 2003, by Mayer et al., which has been incorporated by reference, teaches a generalized method for conducting electroless deposition of cobalt using three distinct process phases in a thin-liquid-layer reactor. The teachings of U.S. application Ser. No. 10/609,518 are adaptable to methods and apparati in accordance with the present invention.

The particular systems, designs, methods and compositions described herein are intended to illustrate the functionality and versatility of the invention, but should not be construed to be limited to those particular embodiments. Systems and methods in accordance with the invention are useful in a wide variety of circumstances and applications to conduct a liquid chemical reaction treatment and other liquid-phase and gas-phase treatments performed on an integrated circuit substrate. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

What is claimed is:

1. An apparatus for fluid treatment of a surface of an integrated circuit wafer, comprising:
a microcell container having a bottom wall, a sidewall and a top opening, wherein said bottom wall comprises an inside bottom surface and said sidewall comprises an inside sidewall surface;
a fluid port for injecting fluid into said microcell container;
a substrate carrier for holding an integrated circuit wafer in a carrier/wafer assembly, said carrier/wafer assembly being movable to a treating position in which said carrier/wafer assembly substantially closes said top opening and forms a thin enclosed treatment space defined by said inside bottom surface, said inside sidewall surface and said carrier/wafer assembly;
a rinse shield located above a top edge of said microcell container; and
a rinsing nozzle for rinsing a wafer treatment surface after fluid treatment.

2. An apparatus as in claim 1, further comprising:
a mounting plate located below said bottom wall; and
a bottom-insulating space between said mounting plate and said bottom wall.

3. An apparatus as in claim 2, further comprising:
a plurality of mounting studs located in said bottom-insulating space between said bottom wall and said mounting plate, said mounting studs supporting said microcell container above said mounting plate.

4. An apparatus as in claim 3 wherein:
said mounting plate is thermally insulated; and
said mounting studs are thermally insulating.

5. An apparatus as in claim 1 wherein:
said rinse shield comprises a shield opening; and
said carrier/wafer assembly is movable to a rinse position in which said carrier/wafer assembly substantially closes said shield opening to form a rinsing space.

6. An apparatus as in claim 5 wherein:
said substrate carrier in said rinse position is configured to hold an integrated circuit wafer in a substantially face-down orientation.

7. An apparatus as in claim 1 wherein:
said microcell container and said carrier/wafer assembly are tiltable equally at a non-horizontal angle.

8. An apparatus as in claim 1, further comprising:
a tilt table; and
a vertical lift mounted on said tilt table; wherein
said substrate carrier is mounted to said tilt table via said vertical lift;
said microcell container is mounted on said tilt table; and
said tilt table is operable to tilt said substrate carrier and said microcell container equally to a non-horizontal angle.

9. An apparatus for fluid treatment of a surface of an integrated circuit wafer, comprising:
a microcell container having a bottom wall, a sidewall and a top opening, wherein said bottom wall comprises an inside bottom surface and said sidewall comprises an inside sidewall surface;
a fluid port located proximate to said bottom wall of said microcell container;
a substrate carrier for holding an integrated circuit wafer in a carrier/wafer assembly, said carrier/wafer assembly being movable to a treating position in which said carrier/wafer assembly substantially closes said top opening and forms a thin enclosed treatment space defined by said inside bottom surface, said inside sidewall surface and said carrier/wafer assembly;
a rinse shield, a substantial portion of said rinse shield being located above said microcell container; and
a rinsing nozzle for rinsing said wafer treatment surface after said fluid treating.
wherein said microcell container and said carrier/wafer assembly are operable to be tilted equally to a non-horizontal angle.

10. An apparatus as in claim 9 wherein:
said microcell container and said carrier/wafer assembly are operable to be tilted to a non-horizontal angle so that said fluid port is in a lowered position lower than a substantial portion of said inside bottom surface; and
said fluid port is operable to drain liquid out of said microcell container when said fluid port is in said lowered position.

11. An apparatus as in claim 9, further comprising:
a mounting plate located below said bottom wall; and
a bottom-insulating space between said mounting plate and said bottom wall.

12. An apparatus as in claim 11, further comprising:
a plurality of mounting studs located in said bottom-insulating space between said bottom wall and said mounting plate, said mounting studs supporting said microcell container above said mounting plate.

13. An apparatus as in claim 12 wherein:
said mounting plate is thermally insulated; and
said mounting studs are thermally insulating.

14. An apparatus as in claim 9, further comprising:
a plastic coating covering at least a portion of said inside bottom surface and of said inside sidewall surface.

15. An apparatus as in claim 9 wherein:
said rinse shield comprises a shield opening; and
said carrier/wafer assembly is movable to a rinse position in which said carrier/wafer assembly substantially closes said shield opening to form a rinsing space.

16. An apparatus as in claim 15 wherein:
said substrate carrier in said rinse position is configured to hold an integrated circuit wafer in a substantially face-down orientation.

17. An apparatus as in claim 9, further comprising:
a tilt table; and
a vertical lift mounted on said tilt table; wherein said substrate carrier is mounted to said tilt table via said vertical lift;
said microcell container is mounted to said tilt table; and
said tilt table is operable to tilt said substrate carrier and said microcell container equally to a non-horizontal angle.

18. An apparatus as in claim 17 wherein:
said microcell container is mounted to said tilt table via a mounting plate.

19. An apparatus for fluid treatment of a surface of an integrated circuit wafer, comprising:
a microcell container having a bottom wall, a sidewall and a top opening, wherein said bottom wall comprises an inside bottom surface and said sidewall comprises an inside sidewall surface;
a fluid port located proximate to said bottom wall of said microcell container;
a substrate carrier for holding an integrated circuit wafer in a carrier/wafer assembly, said carrier/wafer assembly being movable to a treating position in which said carrier/wafer assembly substantially closes said top opening and forms a thin enclosed treatment space defined by said inside bottom surface, said inside sidewall surface and said carrier/wafer assembly; and
an electromagnet located in a wall of said microcell;
wherein said microcell container and said carrier/wafer assembly are operable to be tilted equally to a non-horizontal angle.

20. An apparatus for fluid treatment of a surface of an integrated circuit wafer, comprising:
a microcell container having a bottom wall, a sidewall and a top opening, wherein said bottom wall comprises an inside bottom surface and said sidewall comprises an inside sidewall surface;
a fluid port located proximate to said bottom wall of said microcell container;
a substrate carrier for holding an integrated circuit wafer in a carrier/wafer assembly, said carrier/wafer assembly being movable to a treating position in which said carrier/wafer assembly substantially closes said top opening and forms a thin enclosed treatment space defined by said inside bottom surface, said inside sidewall surface and said carrier/wafer assembly; and
an electromagnet located in said substrate carrier;
wherein said microcell container and said carrier/wafer assembly are operable to be tilted equally to a non-horizontal angle.

21. An apparatus for fluid treatment of a surface of an integrated circuit wafer, comprising:
a microcell container having a bottom wall, a sidewall and a top opening, wherein said bottom wall comprises an inside bottom surface and said sidewall comprises an inside sidewall surface;
a fluid port located proximate to said bottom wall of said microcell container;
a substrate carrier for holding an integrated circuit/wafer in a carrier/wafer assembly, said microcell container being movable to a treating position in which said carrier/wafer assembly substantially closes said top opening and forms a thin enclosed treatment space defined by said inside bottom surface, said inside sidewall surface and said carrier/wafer assembly;
a tilt table; and
a vertical lift mounted on said tilt table; wherein
said substrate carrier is mounted to said tilt table via said vertical lift;
said microcell container is mounted to said tilt table; and
said tilt table is operable to tilt said substrate carrier and said microcell container equally to a non-horizontal angle.

22. An apparatus as in claim 21 wherein:
said microcell container and said carrier/wafer assembly are operable to be tilted to a non-horizontal angle so that said fluid port is in a lowered position lower than a substantial portion of said inside bottom surface; and
said fluid port is operable to drain liquid out of said microcell container when said fluid port is in said lowered position.

23. An apparatus as in claim 21, further comprising:
a mounting plate located below said bottom wall; and
a bottom-insulating space between said mounting plate and said bottom wall.

24. An apparatus as in claim 23, further comprising:
a plurality of mounting studs located in said bottom-insulating space between said bottom wall and said mounting plate, said mounting studs supporting said microcell container above said mounting plate.

25. An apparatus as in claim 24 wherein:
said mounting plate is thermally insulated; and
said mounting studs are thermally insulating.

26. An apparatus as in claim 21, further comprising:
a plastic coating covering at least a portion of said inside bottom surface and of said inside sidewall surface.

27. An apparatus as in claim 21, further comprising:
a rinse shield, a substantial portion of said rinse shield being located above said microcell container; and
a rinsing nozzle for rinsing said wafer treatment surface after said fluid treating.

28. An apparatus as in claim 27 wherein:
said rinse shield comprises a shield opening; and
said carrier/wafer assembly is movable to a rinse position in which said carrier/wafer assembly substantially closes said shield opening to form a rinsing space.

29. An apparatus as in claim 28 wherein:
said substrate carrier in said rinse position is configured to hold an integrated circuit wafer in a substantially face-down orientation.

30. An apparatus as in claim 21, further comprising:
an electromagnet located in a wall of said microcell.

31. An apparatus as in claim 21, further comprising:
an electromagnet located in said substrate carrier.

32. An apparatus as in claim 21 wherein:
said microcell container is mounted to said tilt table via a mounting plate.

* * * * *